United States Patent
Lapidus

(10) Patent No.: US 6,975,152 B1
(45) Date of Patent: Dec. 13, 2005

(54) FLIP FLOP SUPPORTING GLITCHLESS OPERATION ON A ONE-HOT BUS AND METHOD

(75) Inventor: Peter D. Lapidus, Boulder, CO (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/420,229

(22) Filed: Apr. 22, 2003

(51) Int. Cl.[7] .............................. H03K 3/289
(52) U.S. Cl. .................. 327/202; 327/203; 327/197
(58) Field of Search ............... 327/202, 203, 327/204, 200, 197, 198, 199, 208, 218; 371/22.3; 365/189

(56) References Cited

U.S. PATENT DOCUMENTS

| | | | |
|---|---|---|---|
| 4,181,862 A * | 1/1980 | Dingwall ..................... 377/117 |
| 5,015,875 A * | 5/1991 | Giles et al. .................. 327/203 |
| 5,703,513 A * | 12/1997 | Hashizume et al. ........ 327/202 |
| 6,366,113 B1 * | 4/2002 | Song ............................ 326/24 |
| 6,624,677 B1 * | 9/2003 | Wissel ......................... 327/202 |

OTHER PUBLICATIONS

Jacob Millman, Integrated Electronics; Analog and Digital circuits and Systems, Mc Graw-Hill, 1972, pp. 624-632.*

* cited by examiner

Primary Examiner—Tuan T. Lam
Assistant Examiner—Hiep Nguyen

(57) ABSTRACT

A flip flop includes a master portion operable to latch at least one of an input signal and an inverted input signal. The flip flop also includes a slave portion operable to latch at least one of the signal latched by the master portion and an inverted signal latched by the master portion in response to a first phase of a clock signal. The slave portion is also operable to be reset in response to a second phase of the clock signal.

14 Claims, 3 Drawing Sheets

FLIP FLOP SUPPORTING GLITCHLESS OPERATION ON A ONE-HOT BUS AND METHOD

TECHNICAL FIELD

This disclosure is generally directed to integrated circuits and more specifically to a flip flop supporting glitchless operation on a one-hot bus and method.

BACKGROUND

Conventional microprocessor chips and other integrated circuits often use buses to couple components in the integrated circuits. One type of bus is a "one-hot" bus. A one-hot bus represents a bus that can transport multiple signals but where only one signal should be active at any given time. Conventional flip flops are often connected to and drive a one-hot bus.

A problem with conventional integrated circuits is that the conventional flip flops typically allow multiple signals on the one-hot bus to be active at the same time. For example, if multiple flip flops are coupled to a one-hot bus, one flip flop may drive a zero-to-one transition while another flip flop is driving a one-to-zero transition. As a result, multiple signals may be active at the same time to drive the two transitions. Even though the multiple signals both may be active for only a short period of time, the integrated circuit may not function properly. As an example, in a memory array, this could cause multiple memory locations to be accessed at the same time. Also, if the bus does not reset properly, the memory array would not be able to precharge properly, affecting its operation.

SUMMARY

This disclosure provides a flip flop supporting glitchless operation on a one-hot bus and method.

In one embodiment, a flip flop includes a master portion operable to latch at least one of an input signal and an inverted input signal. The flip flop also includes a slave portion operable to latch at least one of the signal latched by the master portion and an inverted signal latched by the master portion in response to a first phase of a clock signal. The slave portion is also operable to be reset in response to a second phase of the clock signal.

In another embodiment, a method includes receiving a clock signal at a flip flop. The clock signal has a repeating clock cycle, where each clock cycle includes a first phase and a second phase. The method also includes setting an output of the flip flop in response to the first phase of one of the clock cycles. In addition, the method includes resetting the output of the flip flop in response to the second phase of one of the clock cycles.

One or more technical features may be present according to various embodiments of this disclosure. Particular embodiments of this disclosure may exhibit none, some, or all of the following features depending on the implementation. For example, in one embodiment, a flip flop supporting glitchless operation on a one-hot bus is provided. In a particular embodiment, the flip flop sets its output during a rising edge of a clock signal and then resets its output during a falling edge of the clock signal.

Multiple flip flops may also be connected to a bus. Each flip flop may set its output during a rising edge of the clock signal and then reset its output during a falling edge of the clock signal. In this way, only one flip flop attempts to drive a transition during the rising edge of the clock signal and during the falling edge of the clock signal. This may help to reduce or eliminate the likelihood that multiple flip flops will attempt to drive multiple transitions at the same time. This may also help to reduce or eliminate-errors or glitches caused by multiple signals being active on the bus at the same time. As particular examples, this may help to reduce or eliminate the likelihood that multiple memory locations in a memory array would be accessed at the same time. This may also help to ensure that a bus in the memory array resets and precharges properly.

This has outlined rather broadly several features of this disclosure so that those skilled in the art may better understand the DETAILED DESCRIPTION that follows. Additional features may be described later in this document. Those skilled in the art should appreciate that they may readily use the concepts and the specific embodiments disclosed as a basis for modifying or designing other structures for carrying out the same purposes of this disclosure. Those skilled in the art should also realize that such equivalent constructions do not depart from the spirit and scope of the invention in its broadest form.

Before undertaking the DETAILED DESCRIPTION below, it may be advantageous to set forth definitions of certain words and phrases used throughout this patent document. The terms "include" and "comprise" as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, or software, or a combination of at least two of the same. It should be noted that the functionality associated with any particular controller may be centralized or distributed, whether locally or remotely. Definitions for certain words and phrases are provided throughout this patent document, and those of ordinary skill in the art should understand that in many, if not most instances, such definitions apply to prior as well as future uses of such defined words and phrases.

BRIEF DESCRIPTION OF THE DRAWINGS

For a more complete understanding of this disclosure and its features, reference is now made to the following description taken in conjunction with the accompanying drawings, in which.

DETAILED DESCRIPTION

Figure 1:
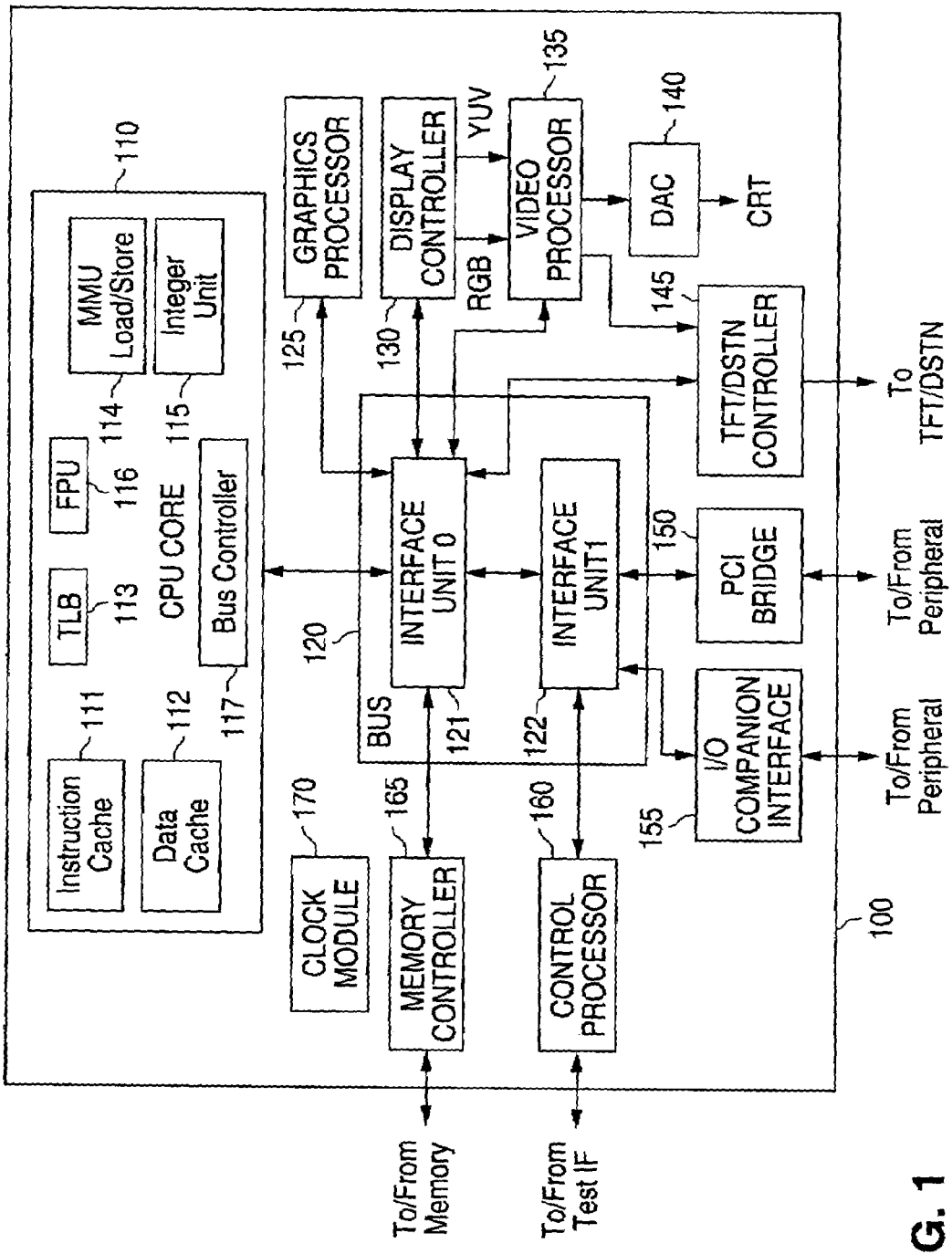
FIG. 1 illustrates an example processing system according to one embodiment of this disclosure.

FIG. 1 is a block diagram of an example processing system 100 according to one embodiment of this disclosure. The processing system 100 illustrated in FIG. 1 is for illustration only. Other processing systems could be used without departing from the scope of this disclosure.

In the illustrated example, the processing system 100 includes a central processing unit (CPU) core 110. The CPU core 110 executes instructions, such as integer instructions and floating point instructions. For example, the CPU core 110 could execute instructions contained in an application executed by a host computer. In one embodiment, the processing system 100 represents an x86 compatible device. In a particular embodiment, the CPU core 110 executes instructions in a combination of instruction sets, such as the Intel Pentium, Intel Pentium Pro, AMD K6 3DNow!, AMD K7 3DNow!, AMD K7 MMX, and National Semiconductor GX1 instruction sets.

In this example, the CPU core 110 includes an instruction cache 111, a data cache 112, a translation look-aside buffer (TLB) 113, a memory management unit (MMU) load/store block 114, an integer unit 115, a floating point unit (FPU) 116, and a bus controller 117. The instruction cache 111 and the data cache 112 represent memories used to store and facilitate retrieval of information used by the CPU core 110. For example, the instruction cache 111 could store instructions that have been, are, or may be executed by the integer unit 115 or the FPU 116. The data cache 112 could store data being processed by the integer unit 115 or the FPU 116, such as operands in an arithmetic operation. The caches 111, 112 could represent any suitable memory device or combination of devices. In one embodiment, each cache 111, 112 represents sixteen kilobytes of memory space. In a particular embodiment, each cache 111, 112 represents a single-clock access, sixteen kilobyte, four-way set associative cache. While FIG. 1 illustrates two separate caches 111, 112, the caches 111, 112 could be combined into a single memory or further subdivided into additional memories. Also, the caches 111, 112 could store any other or additional information.

The TLB 113 and MMU 114 support the use of virtual memory addresses by the processing system 100. For example, the processing system 100 may allow applications to use virtual addresses to store and retrieve instructions and data. When the application is executed, the MMU 114 may receive the virtual memory address and access the TLB 113. The TLB 113 includes a table identifying various virtual addresses and the physical addresses corresponding to those virtual addresses. Using the TLB 113, the MMU 114 converts the received virtual address into a physical memory address. The processing system 100 may then use the physical memory address to access a memory.

The integer unit 115 executes integer instructions. In one embodiment, the integer unit 115 includes a single-issue, eight-stage pipeline. In a particular embodiment, the integer pipeline includes an instruction prefetch stage, an instruction predecode stage, an instruction decode stage, an instruction queue stage, two address calculation stages, an execution stage, and a writeback stage.

In the instruction prefetch stage, raw instructions are fetched from the instruction cache 111. The instruction predecode stage extracts prefix bytes from the raw instruction bits. The predecode operation also looks-ahead to the next instruction and a potential bubble can be eliminated if the pipeline stalls downstream. The instruction decode stage performs a full decode of the instruction data and indicates the instruction length back to the prefetch stage, allowing the prefetch stage to shift the appropriate number of bytes to the beginning of the next instruction.

The instruction queue stage comprises a first in-first out (FIFO) queue containing decoded x86 instructions. The instruction queue allows the instruction decode stage to proceed even if the pipeline is stalled downstream. Register read operations for data operand address calculations are performed in the instruction queue stage. The first address calculation stage computes the linear address of operand data (if required) and issues requests to data cache 112. Microcode can take over the pipeline and inject a micro-box if multi-box instructions require additional data operands. In the second address calculation stage, operand data (if required) is returned and set up to the execution unit stage with no bubbles if there was a data cache hit. Segment limit checking also is performed on the data operand address. The micro-read-only-memory (>ROM) is read for setup to the execution unit stage.

In the execution unit stage, register and/or data memory fetches are fed through an arithmetic logic unit (ALU) for arithmetic or logical operations. The $\mu$ROM may fire for the first instruction box into the pipeline. Microcode may control the pipeline and insert additional boxes in the execution unit stage if the instruction requires multiple execution unit stages to complete. The writeback stage writes results of the execution unit stage to the register file or to data memory.

The FPU 116 executes floating point instructions. In one embodiment, the FPU 116 includes multiple pipelines, such as an execution pipeline and a load/store pipeline. Also, the FPU 116 can execute instructions in one or more instruction sets, such as the x87, MMX, and 3DNow! instruction sets. The FPU 116 could also support dynamic scheduling of instructions, which may help to reduce stalls in the pipelines of the FPU 116. The FPU 116 could further support out-of-order execution and register renaming. In addition, the FPU 116 could perform floating point operations in accordance with the IEEE 754 standard and support an instruction issue rate of one instruction per clock from the integer core. In a particular embodiment, the FPU 116 could have a data path that is optimized for single precision arithmetic, while extended precision arithmetic is handled by microcode and multiple passes through the pipelines of the FPU 116.

The bus controller 117 facilitates communication between the CPU core 110 and other components of the processing is system 100. For example, when needed data is not available in the caches 111, 112, the bus controller 117 could support the transfer of the data from the external memory to the CPU core 110 over an internal bus 120.

The internal bus 120 facilitates communication between various components of the processing system 100. In this example, the bus 120 includes a first interface unit 121 and a second interface unit 122. The first interface unit 121 facilitates communication between higher-speed components of the processing system 100, while the second interface unit 122 facilitates communication between lower-speed components of the processing system 100. The interface units 121, 122 may also communicate with each other so that the higher-speed components and the lower-speed components may communicate. While FIG. 1 may illustrate a certain component of the processing system 100 as representing a "higher-speed" or "lower-speed" component, this is for illustration only. Each component could operate at any suitable speed.

A graphics processor 125 processes graphics data for display to a user. The graphics processor 125 could, for example, include a bit block transfer (bitBLT) engine, a raster operations (ROP) unit, and an alpha compositing unit. The bitBLT engine transforms blocks of pixels, such as by changing colors or shades of pixels or rotating a block of pixels. The ROP unit performs various raster operations on the graphics data, such as 256 standard raster operations.

The alpha compositing unit supports transparency of the graphics data. The graphics processor 125 could further support pattern generation, source expansion, pattern/source transparency, and ternary raster operations.

A display controller 130 generates displays for presentation to a user, including displays using the graphics produced by the graphics processor 125. The display controller 130 may retrieve graphics, video, and overlay streams from a frame buffer, serialize the streams, and perform any color look-ups and output formatting. The display controller 130 may also interface with a display filter for driving a display device. The display controller 130 may include a graphical user interface (GUI) and a video graphics array (VGA), which provides full hardware compatibility with the VGA graphics standard. For example, the VGA may pass eight-bit pixels and sync signals to the GUI, which may expand the pixels to 24-bit color values using a color lookup table.

A video processor 135 receives graphics data, video data, or other information to be displayed. The video processor 135 then outputs digital data capable of being displayed to a user. For example, the video processor 135 could mix graphics and video streams and output digital red, green, and blue (RGB) data. The video processor 135 could be capable of delivering high resolution and true color graphics. The video processor 135 may also overlay or blend a scaled true color video image on the graphics background.

The output of the video processor 135 may be supplied to a digital to analog converter (DAC) 140 or a Thin Film Transistor/Double-Layer Supertwist Nematic (TFT/DLSN) controller 145. The DAC 140 converts the digital values from the video processor 135 into analog values for display on a cathode ray tube (CRT). The DAC 140 may, for example, represent a 3×8 bit DAC. The TFT/DLSN controller 145 uses the digital values from the video processor 135 to generate a digital output signal suitable for display on a flat-panel liquid crystal display (LCD). In a particular embodiment, the TFT/DSTN controller 145 may drive all standard flat panel monitors up to 1024×768 resolution.

A PCI bridge 150 facilitates communication with an external PCI bus. For example, the PCI bridge 150 could support communication with a sound card, disk drive, or other device over the PCI bus. In one embodiment, the PCI bridge 150 includes read and write FIFO queues, an interface controller, and a PCI arbiter.

An input/output (I/O) companion interface 155 allows the processing system 100 to receive several signals that support functions such as resets, interrupts, and system power management.

A control processor 160 manages reset control, the macro clock, and debugging functions in the processing system 100. In one embodiment, the control processor 160 includes a JTAG interface and scan chain control logic. The control processor 160 also supports chip reset, which includes initial phase-locked loop (PLL) control and programming, and runtime power management macro-clock control. The JTAG support may include a TAP controller that is IEEE 1149.1 compliant. Control of the processing system 100 can be obtained through the JTAG interface into the TAP controller. Internal registers, including registers in the CPU core 110, may be accessed. In-circuit emulation (ICE) capabilities may be supported through the JTAG and TAP controller interface.

A memory controller 165 facilitates access to one or more external memories, such as one or more RAM modules or a mass storage device like a hard drive. For example, various components of the processing system 100, such as the CPU core 110, graphics processor 125, display controller 130, and TFT/DSTN controller 145, may need to store or retrieve data from the external memory, and the memory controller 165 facilitates access to the external memory. In one embodiment, the memory controller 165 can facilitate access to both single data rate (SDR) and dual data rate (DDR) memory. Also, the memory controller 165 can facilitate access to any amount of external memory, such as one gigabyte of memory. In a particular embodiment, the memory controller 165 allows data used by the CPU core 110 and graphics data to be stored in the external memory, thereby supporting a unified memory architecture (UMA).

A clock module 170 generates clock signals used by the various components of the CPU 100. For example, the clock module 170 could generate signals used by the CPU core 110 to execute integer and floating point instructions.

In one aspect of operation, various components of the processing system 100 may include flip flops that drive a bus. As a particular example, the FPU 116 may include multiple flip flops connected to a one-hot bus that drives wordline drivers for a memory array. In one embodiment, each flip flop can set its output during a rising edge of a clock signal and then reset its output during a falling edge of the clock signal. In this way, only one of the flip flops attempts to drive a transition during the rising edge of the clock signal, and only one of the flip flops attempts to drive a transition during the falling edge of the clock signal. This may help to reduce or eliminate errors or glitches caused by multiple signals being active on the bus at the same time.

Although FIG. 1 illustrates one example of a processing system 100, various changes may be made to FIG. 1. For example, the flip flop described above could be used in any other processing system or any other integrated circuit and is not limited to the processing system 100 illustrated in FIG. 1. Also, the functional division of the components in FIG. 1 is for illustration only. Various components can be combined or omitted and additional components can be added according to particular needs. In addition, each component illustrated in FIG. 1 may be implemented in any hardware, software, firmware, or combination thereof.

Figure 2:
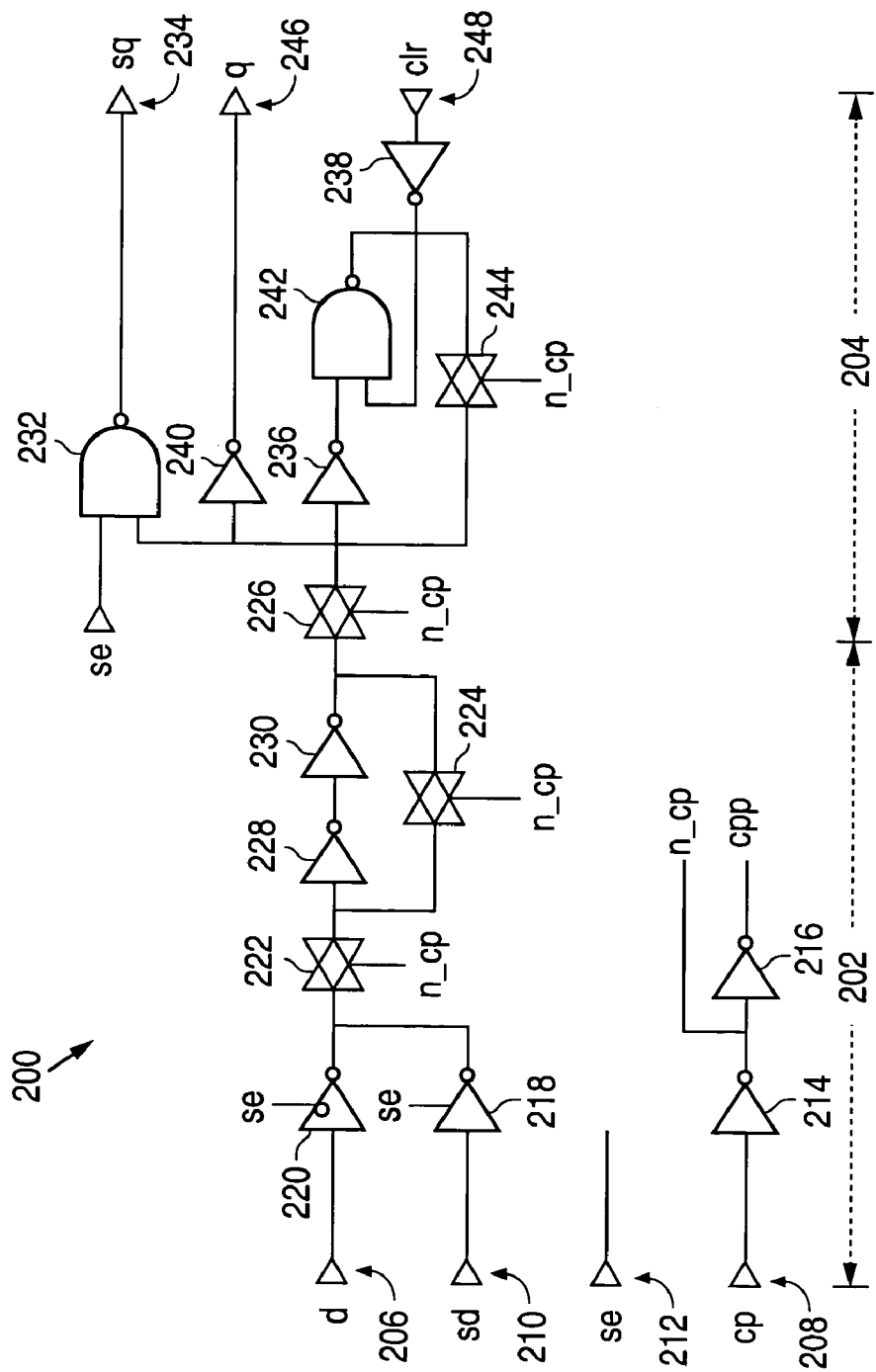
FIG. 2 illustrates an example flip flop according to one embodiment of this disclosure.

FIG. 2 illustrates an example flip flop 200 according to one embodiment of this disclosure. The flip flop 200 shown in FIG. 2 is for illustration only. Other flip flops could be used without departing from the scope of this disclosure.

The flip flop 200 shown in FIG. 2 represents a master-slave flip flop. In this example, the flip flop 200 includes a master portion 202 and a slave portion 204. The master portion 202 receives input signals, such as a "D" input signal 206 and a clock signal 208. The master portion 202 may also receive a scan data (SD) signal 210 and a scan enable (SE) signal 212, which are used to test the operation of the flip flop 200.

The master portion 202 includes two inverters 214, 216, which are used to invert and reinvert the clock signal 208. The master portion 202 also includes a tri-state active high-inverter 218 and a tri-state active low inverter 220, which are used to invert the D input signal 206 or the scan data signal 210. The master portion 202 further includes three active high transmission gates 222, 224, 226 and two inverters 228, 230. These components are used to latch the inverted value of the D input signal 206 or the scan data signal 210, depending on whether a test is being performed. In this document, the term "latch" refers to the ability of a component or group of components to hold a signal or value for a specified amount of time.

The slave portion 204 of the flip flop 200 includes a NAND gate 232. This gate generates a test output signal 234, referred to as a "scan Q" (SQ) output. The slave portion 204 also includes three inverters 236, 238, 240, a NAND gate 242, and a transmission gate 244. These components are used to latch the value from the master portion 202 and invert that value, producing a "Q" output signal 246. In effect, this produces an output signal 246 that equals the value of the D input signal 206 or the scan data signal 210.

These components latch the value from the master portion 202 under the control of a clear signal 248. The clear signal 248 is then used to reset the slave portion 204. In one embodiment, the clear signal 248 and the clock signal 208 represent the same signal. In this embodiment, when the clear signal 248 has a high value, the NAND gate 242 allows the output signal 246 to be set equal to the input signal 206 or the scan data signal 210. When the clear signal 248 has a low value, the NAND gate 242 resets the output signal 246.

In this way, the output value 246 may be set during one portion of the clock signal 208 and reset during another portion of the clock signal 208. In particular, the output of the flip flop 200 may be set during the rising edge of the clock signal 208 and reset during the falling edge of the clock signal 208.

Although FIG. 2 illustrates one example of a flip flop 200, various changes may be made to FIG. 2. For example, various components of the flip flop 200 could be replaced by equivalent components that perform the same function.

Figure 3:
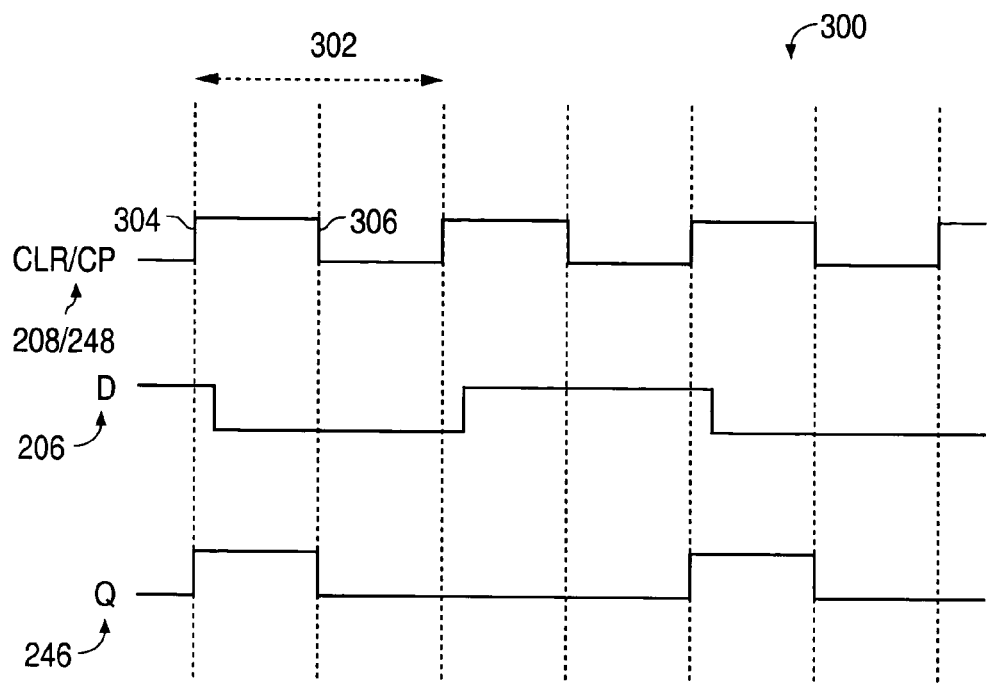
FIG. 3 illustrates a timing diagram of a flip flop according to one embodiment of this disclosure.

FIG. 3 illustrates a timing diagram 300 of a flip is flop according to one embodiment of this disclosure. The timing diagram 300 may be described with respect to the flip flop 200 of FIG. 2. The timing diagram 300 could also be used with any other suitable flip flop.

As shown in FIG. 3, the timing diagram 300 includes the clock signal 208/clear signal 248, the D input signal 206, and the Q output signal 246. The clock signal 208/clear signal 248 has a repeating clock cycle 302 and includes rising edges 304 and falling edges 306.

During the rising edge 304 of the clock signal 208/clear signal 248, the output signal 246 is set to equal the input signal 206. After that, the output signal 246 is reset during the next falling edge 306 of the clock signal 208/clear signal 248. In this example, the output signal 246 is reset to a value of zero. In other embodiments, the output signal 246 could be reset to a value of one.

In the illustrated example, the flip flop 200 drives one transition during the rising edge 304 and drives another transition during the next falling edge 306. When multiple flip flops 200 are coupled to a bus, only one flip flop 200 may drive a transition during each rising edge 304 of the clock signal 208/clear signal 248. Similarly, only one flip flop 200 may drive a transition during each falling edge 306 of the clock signal 208/clear signal 248. As a result, two flip flops 200 are not trying to drive a transition at the same time, reducing glitches in the system.

Although FIG. 3 illustrates one example of a timing diagram 300 for a flip flop 200, various changes may be made to FIG. 3. For example, any other suitable input signal 206 could be used.

Figure 4:
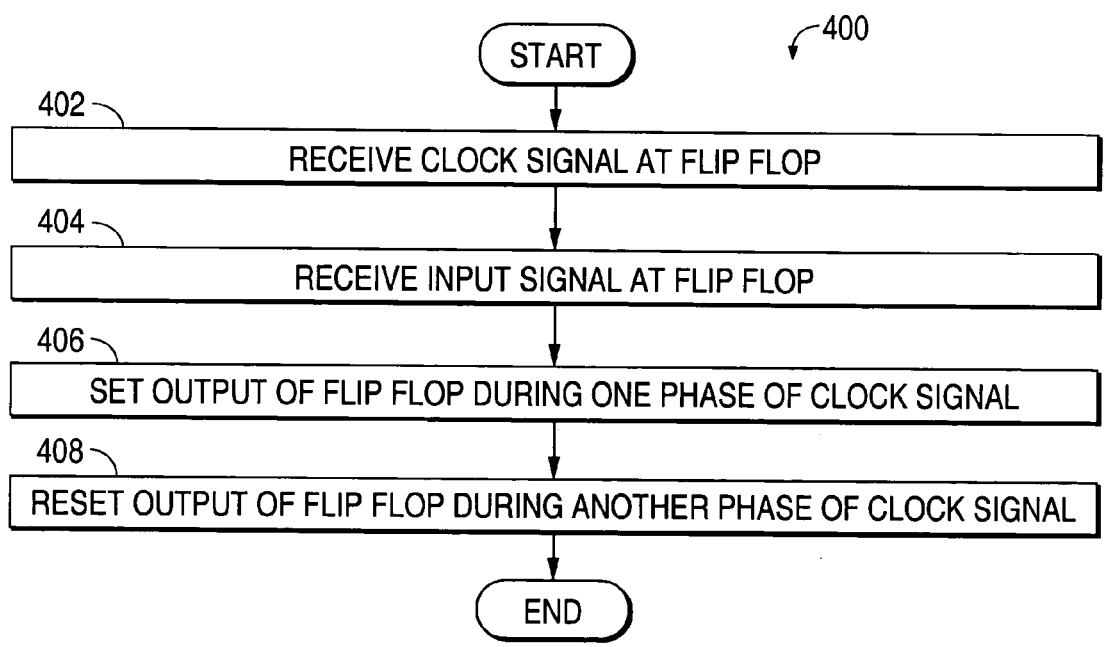
FIG. 4 illustrates an example method for supporting glitchless operation on a one-hot bus.

FIG. 4 illustrates an example method 400 for supporting glitchless operation on a one-hot bus. The method 400 may be described with respect to the flip flop 200 of FIG. 2 operating according to the timing diagram 300 of FIG. 3. Other flip flops operating according to other timing diagrams could be used.

A clock signal is received at the flip flop 200 at step 402. This may include, for example, the flip flop 200 receiving a clock signal 208 having rising edges 304 and falling edges 306. An input signal is received at the flip flop 200 at step 404. This may include, for example, the flip flop 200 receiving a D input signal 206.

The flip flop 200 sets its output during one phase of the clock signal at step 406. This may include, for example, the master portion 202 latching an inverted value of the input signal 206 in response to the rising edge of the clock signal 208/clear signal 248. This may also include the slave portion 202 latching the value from the master portion 202 and inverting the latched value to produce the output signal 246. In this document, the term "phase" refers to a portion of a clock cycle 302 in the clock signal 208.

The flip flop 200 resets its output during another phase of the clock signal at step 408. This may include, for example, resetting the slave portion 204 in response to a falling edge 306 of the clock signal 208/clear signal 248. As a particular example, the slave portion 204 could be reset to output a value of zero.

Although FIG. 4 illustrates one example of a method 400 for supporting glitchless operation on a one-hot bus, various changes may be made to FIG. 4. For example, the flip flop 200 could receive the clock signal and the input signal simultaneously.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A device, comprising:
   a master portion of a flip-flop operable to latch at least one of an input signal and an inverted input signal; and
   a slave portion of the flip flop operable to latch at least one of the signal latched by the master portion and an inverted signal latched by the master portion in response to a first phase of a clock signal, the slave portion also operable to be reset in response to a second phase of the clock signal, the slave portion comprising;
   a NAND gate operable to generate a value associated with an output signal in response to the first phase and to reset the value in response to the second phase;
   a first inverter operable to invert the clock signal and supply the inverted clock signal to the NAND gate;
   a second inverter operable to invert the signal latched by the master portion and provide the inverted signal to the NAND gate;
   a third inverter operable to invert the value generated by the NAND gate and produce the output signal; and
   a transmission gate coupled to an output of the NAND gate and an input of the third inverter.

2. The device of claim 1, wherein the slave portion is operable to latch at least one of the signal latched by the master portion and the inverted signal latched by the master portion in response to a rising edge in the clock signal, the slave portion also operable to be reset in response to a falling edge in the clock signal.

3. The device of claim 1, wherein the slave portion outputs a value of zero when reset in response to the second phase of the clock signal.

4. The device of claim 1, wherein the master portion is further operable to receive a scan enable signal and a scan data signal used to test the flip flop.

5. The device of claim 1, wherein the master portion comprises:
   a first inverter operable to invert the input signal;
   a first transmission gate coupled to an output of the first inverter;
   a second inverter coupled to an output of the transmission gate;
   a third inverter coupled to an output of the second inverter;
   a second transmission gate coupled to an output of the third inverter; and
   a third transmission gate having an input coupled to the output of the third inverter and an output coupled to the output of the first transmission gate and to an input of the second inverter.

6. A method comprising:
   receiving a clock signal at a flip flop, the clock signal having a repeating clock cycle, each clock cycle comprising a first phase and a second phase;
   setting an output of the flip flop in response to the first phase of one of the clock cycles; and
   resetting the output of the flip flop in response to the second phase of one of the clock cycles;
   wherein the flip flop comprises a master portion and a slave portion, the slave portion comprising;
      a NAND gate operable to generate a value used to produce the output in response to the first phase and to reset the value in response to the second phase;
      a first inverter operable to invert the clock signal and supply the inverted clock signal to the NAND gate;
      a second inverter operable to invert a signal latched by the master portion and provide the inverted latched signal to the NAND gate;
      a third inverter operable to invert the value generated by the NAND gate and produce the output; and
      a transmission gate coupled to an output of the NAND gate and an input of the third inverter.

7. The method of claim 6, wherein resetting the output of the flip flop comprises the flip flop outputting a value of zero when reset.

8. The method of claim 6, wherein setting and resetting the output of the flip flop comprise:
   setting the output of the flip flop in response to a rising edge in one of the clock cycles; and
   resetting the output of the flip flop in response to a falling edge in that clock cycle.

9. The method of claim 8, wherein the master portion comprises:
   a first inverter operable to invert an input signal;
   a first transmission gate coupled to an output of the first inverter;
   a second inverter coupled to an output of the first transmission gate;
   a third inverter coupled to an output of the second inverter;
   a second transmission gate coupled to an output of the third inverter; and
   a third transmission gate having an input coupled to the output of the third inverter and an output coupled to the output of the first transmission gate and to an input of the second inverter.

10. A device, comprising:
    a master portion of a flip-flop operable to latch at least one of an input signal and an inverted input signal; and
    a slave portion of the flip flop operable to latch at least one of the signal latched by the master portion and an inverted signal latched by the master portion in response to a first phase of a clock signal, the slave portion also operable to be reset in response to a second phase of the clock signal;
    wherein the master portion comprises:
       a first inverter operable to invert the input signal;
       a first transmission gate coupled to an output of the first inverter;
       a second inverter coupled to an output of the first transmission gate;
       a third inverter coupled to an output of the second inverter;
       a second transmission gate coupled to an output of the third inverter; and
       a third transmission gate having an input coupled to the output of the third inverter and an output coupled to the output of the first transmission gate and to an input of the second inverter.

11. The device of claim 10, wherein the slave portion is operable to latch at least one of the signal latched by the master portion and the inverted signal latched by the master portion in response to a rising edge in the clock signal, the slave portion also operable to be reset in response to a falling edge in the clock signal.

12. The device of claim 10, wherein the slave portion outputs a value of zero when reset in response to the second phase of the clock signal.

13. The device of claim 10, wherein the master portion is further operable to receive a scan enable signal and a scan data signal used to test the flip flop.

14. The device of claim 10, wherein the slave portion comprises:
    a NAND gate operable to generate a value associated with an output signal in response to the first phase and to reset the value in response to the second phase;
    a first inverter operable to invert the clock signal and supply the inverted clock signal to the NAND gate;
    a second inverter operable to invert the signal latched by the master portion and provide the inverted signal to the WAND gate;
    a third inverter operable to invert the value generated by the NAND gate and produce the output signal; and
    a transmission gate coupled to an output of the NAND gate and an input of the third inverter.

* * * * *

UNITED STATES PATENT AND TRADEMARK OFFICE
CERTIFICATE OF CORRECTION

PATENT NO. : 6,975,152 B1 Page 1 of 1
APPLICATION NO. : 10/420229
DATED : December 13, 2005
INVENTOR(S) : Peter D. Lapidus It is certified that error appears in the above-identified patent and that said Letters Patent is hereby corrected as shown below:

Column 9, line 47: Please change "claim 8" to --claim 6--

Column 10, line 51: Please change "WAND gate;" to --NAND gate;--

Signed and Sealed this

Twenty-sixth Day of September, 2006

JON W. DUDAS
*Director of the United States Patent and Trademark Office*